United States Patent
Siek et al.

Patent Number: 5,986,955
Date of Patent: Nov. 16, 1999

[54] METHOD AND APPARATUS FOR HIDING DATA PATH EQUILIBRATION TIME

[75] Inventors: David D. Siek; Rajesh Somasekharan, both of Boise, Id.

[73] Assignee: Micron Technology, Inc., Boise, Id.

[21] Appl. No.: 09/234,268

[22] Filed: Jan. 19, 1999

[51] Int. Cl.[6] .................................................. G11C 7/00
[52] U.S. Cl. ............................................ 365/203; 365/190
[58] Field of Search ..................................... 365/200, 203, 365/190

[56] References Cited

U.S. PATENT DOCUMENTS

| | | | |
|---|---|---|---|
| 5,471,426 | 11/1995 | McClure | 365/200 |
| 5,825,693 | 10/1998 | Lee et al. | 365/203 |
| 5,828,612 | 10/1998 | Yu et al. | 365/203 |

*Primary Examiner*—David Nelms
*Assistant Examiner*—M. Tran

*Attorney, Agent, or Firm*—Seed and Berry LLP

[57] ABSTRACT

A hidden data path minimizes equilibration delays in coupling differential data through a complementary data path. The hidden data path may be used for both reading and writing to the memory cell array. The hidden data path includes two sets of complementary I/O lines coupled in parallel between the memory cell array and the DC sense amplifier, and are alternatively coupled between the memory cell array and the DC sense amplifier to receive and transmit data. The set of complementary I/O lines not coupled is equilibrated during this time in preparation for coupling to and transmitting subsequent differential data. The hidden data path may also include two sets of data read lines coupled in parallel between the DC sense amplifier and the output circuitry if used for reading data from the memory cell array. Similarly, a second set of data write lines may be coupled in parallel between the input circuitry and write driver circuit when used for writing data to the memory cell array.

49 Claims, 8 Drawing Sheets

METHOD AND APPARATUS FOR HIDING DATA PATH EQUILIBRATION TIME

TECHNICAL FIELD

The invention relates generally to integrated circuit memory devices, and more particularly, to a data path in a memory device.

BACKGROUND OF THE INVENTION

As the processing speed of microprocessors increases, the demand for memory devices having faster access times also increases. Memory system designers have developed methods and designs that shave off nanoseconds from access times in order to satisfy the demand for high speed memory devices. Such designs have included memory devices having various data access modes, for example, devices that have a burst mode or page mode. Memory system designers have more recently developed synchronous memory systems that allow the pipelined transfer of data at the clock speed of the motherboard. Currently, there has been a movement toward memory designs that can transfer data at clock speeds optimized for the particular memory configuration. However, even with the advances made in memory system designs, the fundamental building blocks of memory devices have remained relatively the same. As will be described in more detail below, these building blocks are the basic elements that are shared among all types of memory devices, regardless of whether they are synchronous or asynchronous, random-access or read-only, or static or dynamic.

A conventional memory device is illustrated in FIG. 1. The memory device includes an address register 12 that receives either a row address or a column address on an address bus 14. The address bus 14 is generally coupled to a memory controller (not shown in FIG. 1). Typically, a row address is initially received by the address register 12 and applied to a row address multiplexer 18. The row address multiplexer 18 couples the row address to a number of components associated with either of two memory bank arrays 20 and 22 depending upon the state of a bank address bit forming part of the row address. The arrays 20 and 22 are comprised of memory cells arranged in rows and columns. Associated with each of the arrays 20 and 22 is a respective row address latch 26, which stores the row address, and a row decoder 28, which applies various signals to its respective array 20 or 22 as a function of the stored row address.

After the row address has been applied to the address register 12 and stored in one of the row address latches 26, a column address is applied to the address register 12. The address register 12 couples the column address to a column address latch 40. The column address latch 40 momentarily stores the column address while it is provided to the column address buffer 44. The column address buffer 44 applies a column address to a column decoder 48, which applies various column signals to respective sense amplifiers and associated column circuits 50 and 52 for the respective arrays 20 and 22.

Data to be read from one of the arrays 20 or 22 are coupled from the arrays 20 or 22, respectively, to a data bus 58 through the column circuit 50 or 52, respectively, and a read data path that includes a data output register 56. Data to be written to one of the arrays 20 or 22 are coupled from the data bus 58 through a write data path, including a data input register 60, to one of the column circuits 50 or 52 where they are transferred to one of the arrays 20 or 22, respectively.

The above-described operation of the memory device 10 is controlled by a command decoder 68 responsive to high level command signals received on a control bus 70. These high level command signals, which are typically generated by the memory controller, are a chip select signal CS*, a write enable signal WE*, a row address strobe signal RAS*, and a column address strobe signal CAS*, where the "*" designates the signal as active low. The command decoder 68 generates a sequence of command signals responsive to the high level command signals to carry out a function (e.g., a read or a write) designated by each of the high level command signals. These command signals, and the manner in which they accomplish their respective functions, are conventional. Therefore, in the interest of brevity, a further explanation of these control signals will be omitted.

As mentioned above, read data are coupled from one of the arrays 20 and 22 to the data bus 58 through a read data path that is shown in greater detail in FIG. 2. The read data path 80 begins in one of the columns in the array 20 (FIG. 1). The column includes a complementary pair of digit lines 84 and 86 coupled to the memory cells in the column. A sense amplifier 88 connected between the digit lines 84 and 86 amplifies a differential data signal 10 on the digit lines 84 and 86 in a well-known manner. The differential data signal indicates the presence of a "1" or a "0" in an enabled memory cell in the column.

The digit lines 84 and 86 are selectively coupled to a complementary pair of I/O lines 90 and 92 through a column switch 89 when the column select signal CSEL0 goes high. Prior to coupling to the digit lines 84, 86, the I/O lines 90, 92 are equilibrated and biased to a predetermined reference voltage level by an equilibration circuit 93. The equilibration circuit 93 ensures that the voltage levels of the I/O lines 90, 92 are approximately equal and at a predetermined reference voltage level so that the differential data signal on the digit lines 84, 86 will be accurately coupled to the I/O lines 90, 92. The equilibration circuit 93 is activated when the equilibration signal EQ goes high. The I/O lines 90 and 92 are also selectively coupled to the digit lines for a large number of other columns, but these other digit lines have been omitted from FIG. 2 for purposes of clarity. The I/O lines 90, 92 must be equilibrated every time the I/O lines 90, 92 are to be coupled to another pair of digit lines.

The I/O lines 90 and 92 are selectively coupled to a complementary pair of data lines 94 and 96 by first and second pass gates 98 and 100. Another pair of I/O lines 194, 196 is also shown coupling to the data lines 94, 96 to represent the fact that the data lines 94, 96 may be selectively coupled to at least one other complementary pair of I/O lines through a multiplexer, which is represented by the pass gates 98, 100, 198, 199. The use of a multiplexer allows the data lines 94, 96 to be shared with several other pairs of I/O lines. A conductive state of each of the pass gates 98 and 100 determines which pair of I/O lines is to be coupled to the data lines 94, 96, and is controlled by a complementary select signals SEL, SEL* derived from the column address. When the pass gates 98 and 100 are rendered conductive, the differential data signal is coupled from the digit lines 84 and 86 through the I/O lines 90 and 92 to the data lines 94 and 96. As with the I/O lines, the data lines 94, 96 need to be equilibrated prior to coupling to the I/O lines 90, 92. The equilibration circuit 93 is activated before the pass gates 98 and 100 become conductive to bias the data lines 94, 96 to an equal and a predetermined voltage reference level. Immediately prior to coupling to the I/O lines 90, 92, the equilibration 93 circuit is deactivated. However, an equilibration circuit (not shown) separate from the equilibration circuit 93 may be used to equilibrate the data lines 94 and 96.

The data lines 94 and 96 are coupled, respectively, to complementary inputs of a DC sense amplifier 110. The DC sense amplifier 110 is a high speed, high gain differential amplifier that amplifies the differential data signal on the data lines 94 and 96 to full CMOS voltage levels. An amplified differential data signal is generated by the DC sense amplifier 110 at complementary outputs and provided to a complementary pair of data read lines 112 and 114. As with the I/O lines and data lines, the data read lines 112, 114 must also be equilibrated by an equilibration circuit 111 prior to amplification by the DC sense amplifier 110 in order to accurately amplify the differential data signal. The data read lines 112 and 114 provide the amplified differential data signal to a complementary pair of inputs in a data output buffer 126, which provides a data signal to a data bus terminal 128 based on the amplified differential data signal. Although not shown in FIG. 2, the DC sense amplifier 110 may be coupled to at least one other complementary pair of data lines (not shown) through a multiplexer (not shown). Thus, the DC sense amplifier 110 may be shared between more than one pair of complementary data lines, in a manner similar to the coupling between the I/O lines and the data lines 94, 96.

In contrast to the data read sequence previously described, the data write sequence begins when input data is received by an input buffer 150 from the data bus terminal 128. Prior to receiving the input data, data write lines 152, 154 have been equilibrated by equilibration circuit 155. The input buffer 150 generates a differential data signal based on the input data and is coupled to a write driver circuit 158 using the data write lines 152, 154. The complementary output terminals of the write driver 158 are coupled to the data lines 94, 96 and the I/O lines 90, 92. When the column switch 89 couples the I/O lines 90, 92 and data lines 94, 96 to a selected pair of digit lines 84, 86, the write driver 158 writes data from the input buffer 150 to the memory cell array 20 (FIG. 1). As illustrated by this example, several elements of the read data paths and write data paths are shared between the read and write operations. For example, the I/O lines 90, 92 and data lines 94, 96 have bidirectional data capability and can be used for both reading from and writing the memory cell array 20. However, other elements are designed to transmit data in only one direction, and are thus specific to either the read or write operation. For example, data read lines 112, 114 are used only for reading data from the memory cell array. When writing data to the memory cell array, the data write lines 152, 154 are used instead.

A common operation with regard to complementary signal lines is that they all must be equilibrated prior to coupling to a differential data signal in order to accurately provide the differential data signal to the next stage of the data path. The problem with existing complementary data paths is that there may be some delay in coupling a differential data signal because of the time it takes to equilibrate the complementary signal lines. For example, in a memory device such as the one shown in FIG. 1, the equilibration time directly adds to the data transfer time of the memory device. The equilibration delay may affect the complementary signal lines used during a data read operation, as well as during a data write operation. The delay associated with equilibration may not be a problem for the complementary digit lines 84 and 86 because the same pair of digit lines is not generally used for successive data transfers. However, the same pair of I/O lines 90 and 92 and the same pair of data lines 94 and 96 are often used for successive data transfers. Before successive data transfers can occur, the I/O lines 90 and 92 and the data lines 94 and 96 must have been equilibrated. As the demand for memory devices having lower data access times becomes greater, the time lag added by any equilibration time may no longer be acceptable. Therefore, there is a need for a data path that can couple differential data without any delay due to equilibrating the data path.

SUMMARY OF THE INVENTION

A method and apparatus for hiding equilibration time of a differential data path using a first and second complementary pair of signal lines alternatively coupled to provide a differential data signal. One complementary pair of signal lines couples the differential data signal while the uncoupled pair of signal lines is equilibrated in preparation for coupling to a subsequent differential data signal. The first and second complementary pair of signal lines may be I/O lines coupled in parallel between a pair of digit lines from a memory cell array and a DC sense amplifier. The first and second complementary pair of signal lines may alternatively or additionally be data read lines coupled in parallel between the DC sense amplifier and the data output circuit. The method and apparatus may be used for both reading from and writing to the memory cell array.

DETAILED DESCRIPTION OF THE INVENTION

Figure 3:
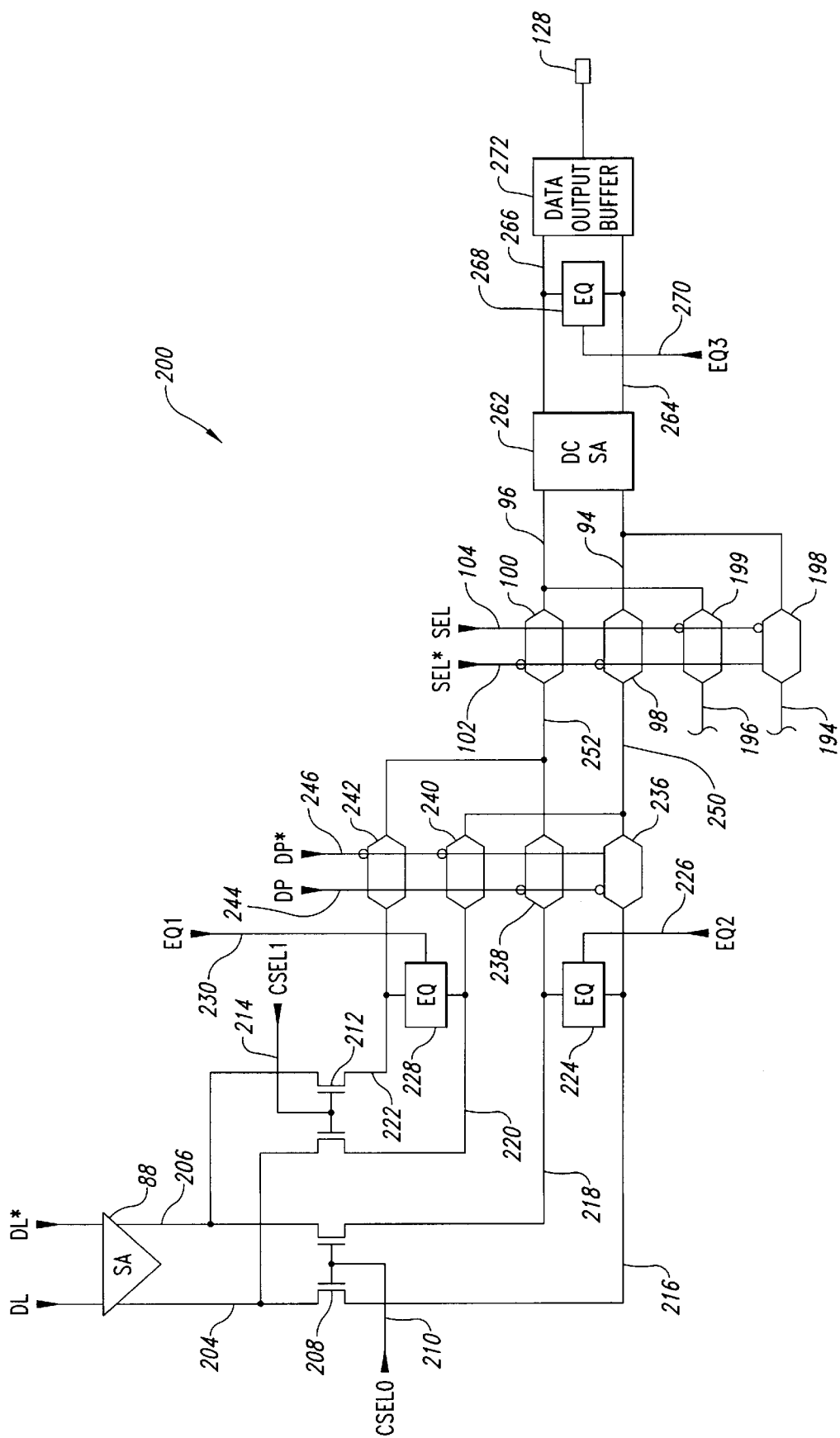
FIG. 3 is a block diagram of a hidden read data path according to an embodiment of the present invention.

A hidden data path 200 according to one embodiment of the invention is shown in FIG. 3. The hidden data path 200 includes two complementary pairs of I/O lines 216, 218 and 220, 222 connected in parallel between the selected digit lines 204, 206 and the data lines 94, 96. As will be explained below, the two pairs of I/O lines 216, 218 and 220, 222 are alternatively selected to transmit the differential data from the digit lines 204, 206 to the DC sense amplifier 262. In order to mask equilibration time, the pair of I/O lines not coupled is equilibrated in preparation for coupling to a subsequent differential data signal on the digit lines 204, 206.

Figure 2:
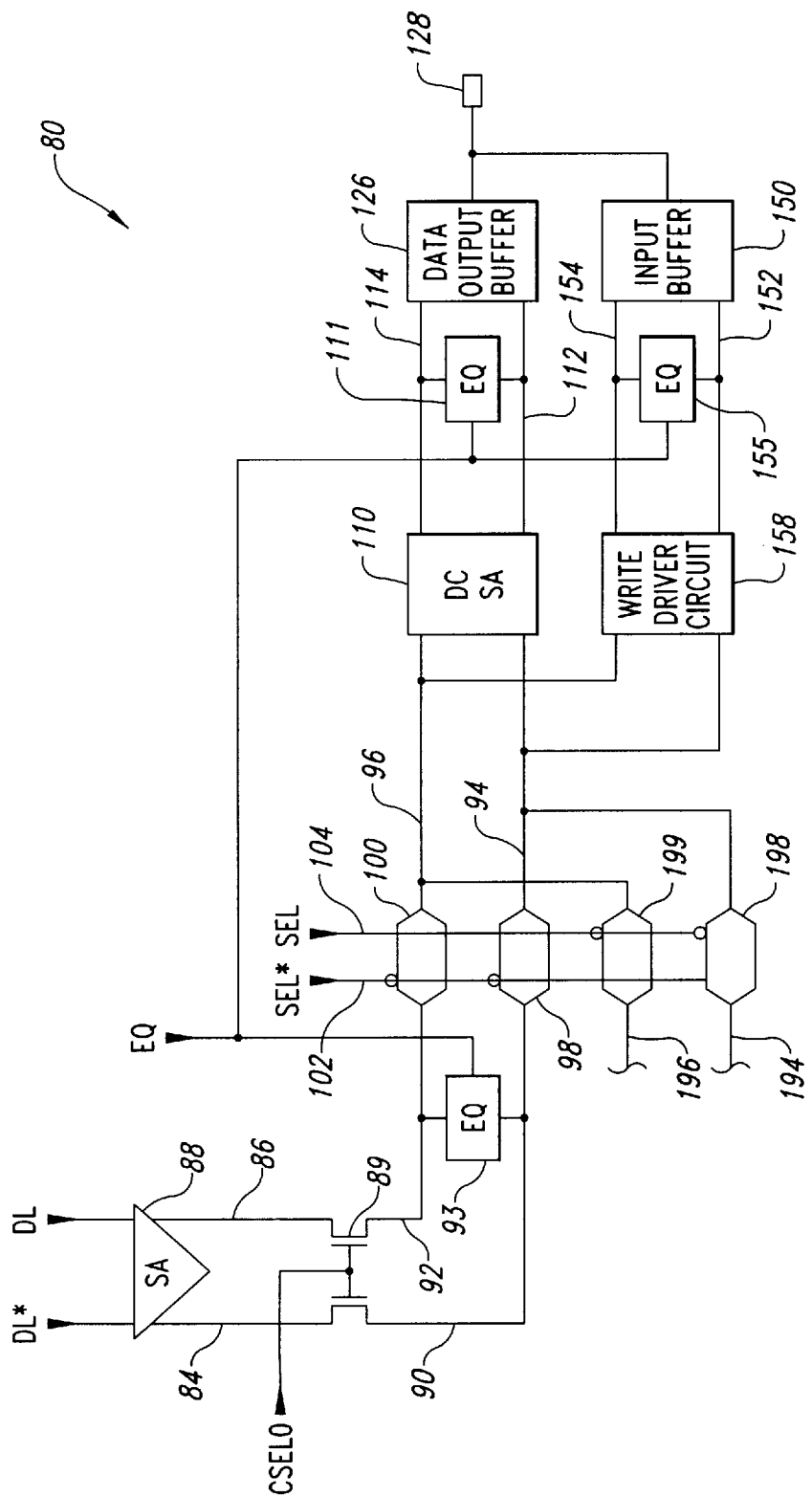
FIG. 2 is a block diagram of a read data path according to the prior art.

In order to simplify the explanation of the hidden data path 200 shown in FIG. 3, portions of the data path shown in FIG. 2 have been omitted. For example, as previously mentioned, the DC sense amplifier 262 may be coupled to at least one other pair of data lines through a multiplexer. However, additional data lines and a multiplexer circuit is not shown. Additionally, the write data path shown in FIG. 2 has also been omitted. Omission of these elements from the figures does not imply that the hidden data path 200 does not include these elements, but merely that they are not necessary for the explanation of a particular embodiment of the invention.

In describing the operation of the hidden data path 200, it will be assumed that the select signals SEL, SEL* on signal lines 102, 104 are set so that the pass gates 98, 100 are enabled and the I/O lines terminating at the nodes 250, 252 are coupled to input of the DC sense amplifier 262 through the data lines 94, 96. Therefore, for the purposes of discussing the operation of the embodiments of the present invention, the nodes 250, 252 may be treated as being synonymous to the input terminals of the DC sense amplifier 262.

The column select signals CSEL0, CSEL1 are provided to the column switches 208, 212, respectively, and determine which pair of the I/O lines 216, 218 or 220, 222 will be connected to the digit lines 204, 206 at a given time. Similarly, the complementary data path select signals DP, DP* provided on signal lines 244, 246 to the control terminals of the pass gates 236, 238, 248, 242 determine which pair of the I/O lines 216, 218 or 220, 222 will be coupled to the DC sense amplifier 262 through the data lines 94, 96. The pass gates may be implemented using a variety of designs known to one skilled in the art. For example, connecting together an NMOS and PMOS transistor by their sources and drains results in a pass gate having two complementary control terminals that can transmit both high and low logic signals.

One ordinarily skilled in the art will appreciate that in order for only one pair of the I/O lines to be connected between the digit lines 204, 206 and the DC sense amplifier 262 at a given time, the CSEL0, CSEL1 signals need to be coordinated with the DP, DP* signals. That is, the respective column select gate and pair of pass gates must be simultaneously enabled to couple the digit lines 204, 206 to the DC sense amplifier 262. The DP, DP* signals may be generated using a toggle flip-flop (not shown). A control circuit (not shown) generating a single control signal that is coordinated with the CSEL0, CSEL1 signals can be coupled to toggle the toggle flip-flop. The complementary output signals of the toggle flip-flop can be used as the DP, DP* signals. Moreover, the equilibration signals EQ1, EQ2 must also be coordinated with the DP, DP* signals to activate the equilibration circuit connected across the pair of I/O lines not coupled.

Figure 4:
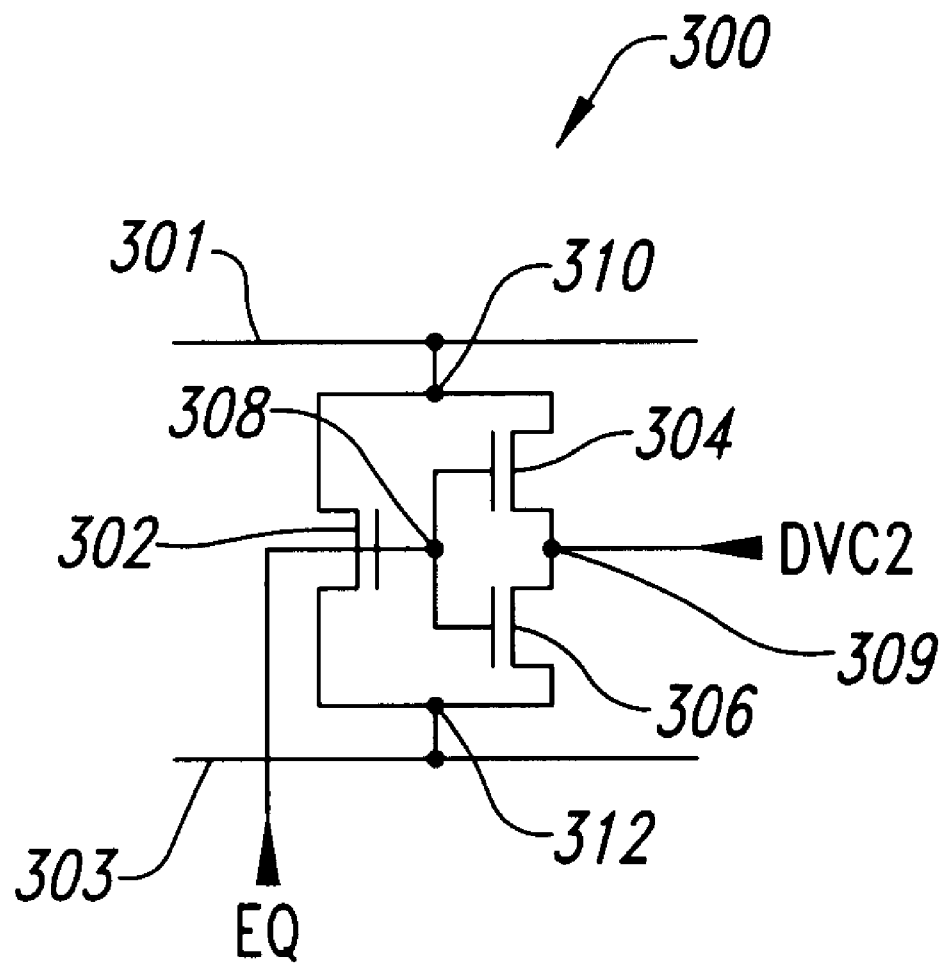
FIG. 4 is a schematic diagram of an equilibration circuit that may be used in the embodiments of the present invention.

An illustration of an equilibration circuit 300 that may be used for the equilibration circuits 228, 224 is shown in FIG. 4. The transistor 302 provides a conductive path between the complementary signal lines 301, 303 to equalize the voltage level of each signal line 301, 302. The transistors 304, 306 are used to precondition the complementary signal lines 301, 303 to the reference voltage level DVC2 connected at the node 309 when the transistors 304, 306 are switched ON. Consequently, when equilibration circuit 300 is activated by the EQ signal going high, the voltage level on each signal line 301, 303 will become equal and preconditioned to the reference voltage level.

In order to coordinate activation of the equilibration circuit 300 with the CSEL0, CSEL1 and DP, DP* signals, the EQ signal may be generated using a simple logic circuit generating an output based on either the DP or DP* signal, and an enable signal provided by a control circuit (not shown) that enables the equilibration circuit when set high. For example, the equilibration circuit 228 should be activated when the I/O lines 220, 222 are uncoupled by the column gate 212 and the pass gates 240, 242. The EQ1 signal that activates the equilibration circuit 228 may be generated by using a two input NAND gate having its output connected to an inverter. The output signal of the inverter will be the EQ1 signal. The enable signal is provided to one input of the NAND gate, and the DP* signal is provided to the other input of the NAND gate. The resulting EQ1 signal will enable the equilibration circuit 228 only when the DP* signal is high, that is, when the I/O lines 216, 218 are coupled between the digit lines 204, 206 and the DC sense amplifier 262, and the I/O lines 220, 222 remain uncoupled. The same simple logic circuit can be used to coordinate the EQ2 signal with the DP, DP* signals by replacing the DP* signal with the DP signal as an input to the NAND gate.

Figure 1:
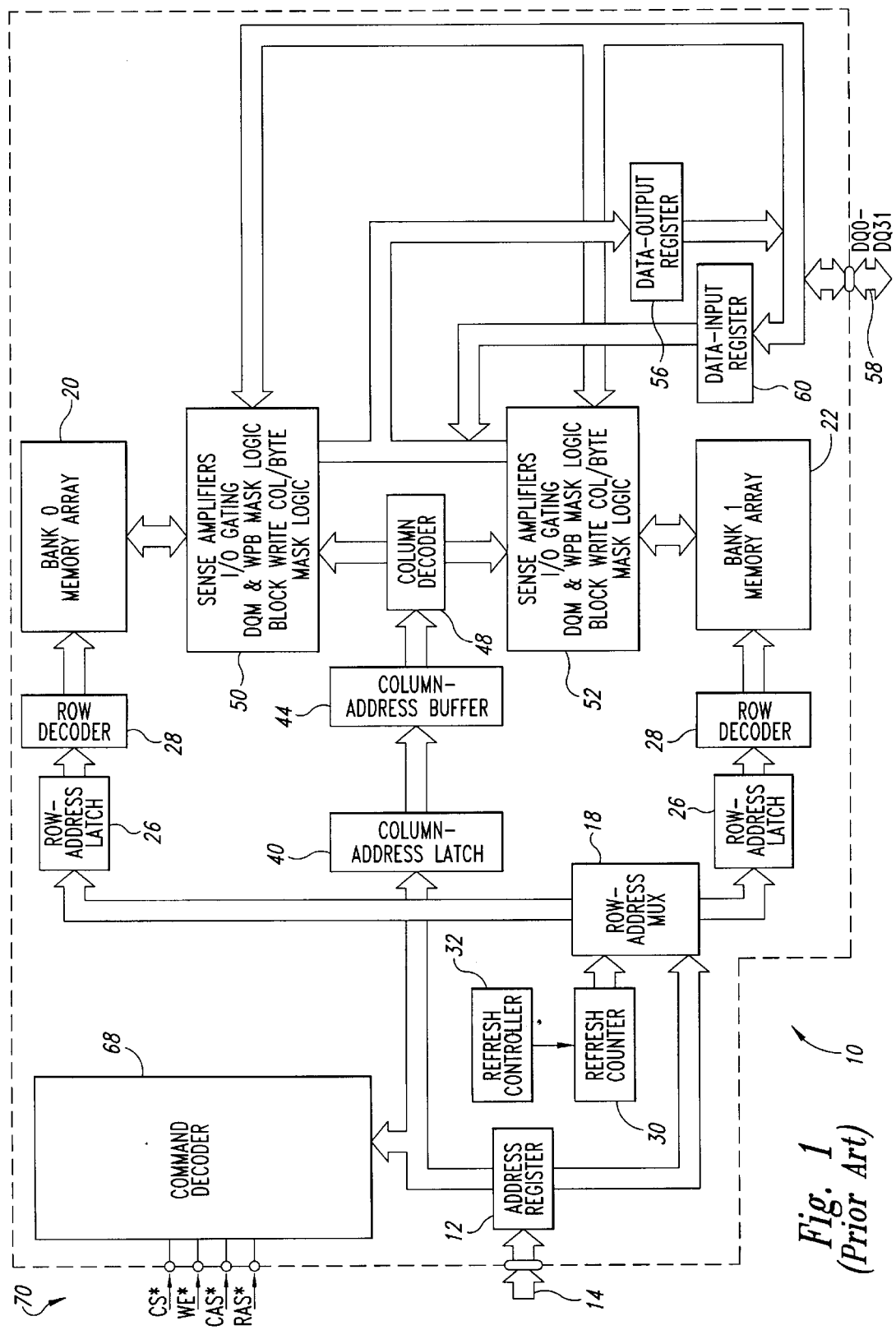
FIG. 1 is a block diagram of a memory device according to the prior art.

As previously described, when data is read from the memory cell array 20 (FIG. 1), one of a plurality of sense amplifiers 88 and digit lines 204, 206 is selected according to a column address to be coupled to the data path and provide a differential data signal. Before coupling, both pairs of the I/O lines 216, 218 and 220, 222 are equilibrated and both column switches 208, 212 are disabled. Upon selecting the particular pair of digit lines 204, 206 from which to receive the differential data signal, the CSEL0 signal changes from low to high, enabling the column switch 208 to couple the I/O lines 216, 218 to the digit lines 204, 206. Consequently, because the DP, DP* signals are coordinated with the CSEL0, CSEL1 signals, the DP signal goes low (and the DP* signal goes high). In this state, the I/O lines 216, 218 provide a continuous conductive path to couple the differential signal from the digit lines 204, 206 to the input of the DC sense amplifier 262. As mentioned previously, it can be assumed that the select signals SEL, SEL* are set so pass gates 98, 100 are enabled. In response to receiving the differential signal, the DC sense amplifier 262 generates an amplified differential signal that is coupled to a complementary pair of data read lines 264, 266 to a data output buffer 272. In contrast, during the time the I/O lines 216, 218 are coupled, the I/O lines 220, 222 remain isolated from the digit lines 204, 206 and the DC sense amplifier 262, and are equilibrated by the equilibration circuit 228.

After the DC sense amplifier 262 has amplified the differential data provided by the I/O lines 216, 218, another memory cell from the memory cell array 20 will be read and a new differential data signal will be provided by a newly selected pair digit lines 204, 206. By virtue of being equilibrated during the transmission of the first differential data, the I/O lines 220, 222 are ready to immediately be coupled to the digit lines 204, 206 and provide the new differential data signal to the DC sense amplifier 262. The CSEL1 and DP signals will go high simultaneously. Consequently, the EQ1 signal goes low and deactivates the equilibration circuit 228, and the column switch 212 and the pair of transfer gates 240, 242 are enabled. In this state, the I/O lines 220, 222 are coupled to the digit lines 204, 206 and the DC sense amplifier 262. The I/O lines 216, 218 are simultaneously uncoupled from the digit lines 204, 206 and the DC sense amplifier 262 because the column switch 208 and the pass gates 236, 238 are disabled by the CSEL0 signal going low and the DP signal going high. Coincident with the DP signal going high to activate the pass gates 236, 238, the equilibration signal EQ2 on the signal line 226 will also goes high and activate the equilibration circuit 224 to equilibrate the I/O lines 212, 218.

As described above, any delay in transmitting the new differential data from the digit lines 204, 206 to the DC sense amplifier 262 has been effectively masked by having a second pair of I/O lines between the digit lines 204, 206 and the DC sense amplifier 262. The I/O lines and the data lines will continue to be alternatively equilibrated and selected to transmit the differential data from digit lines 204, 206 as long as a memory cell of the array 20 is read.

Figure 5:
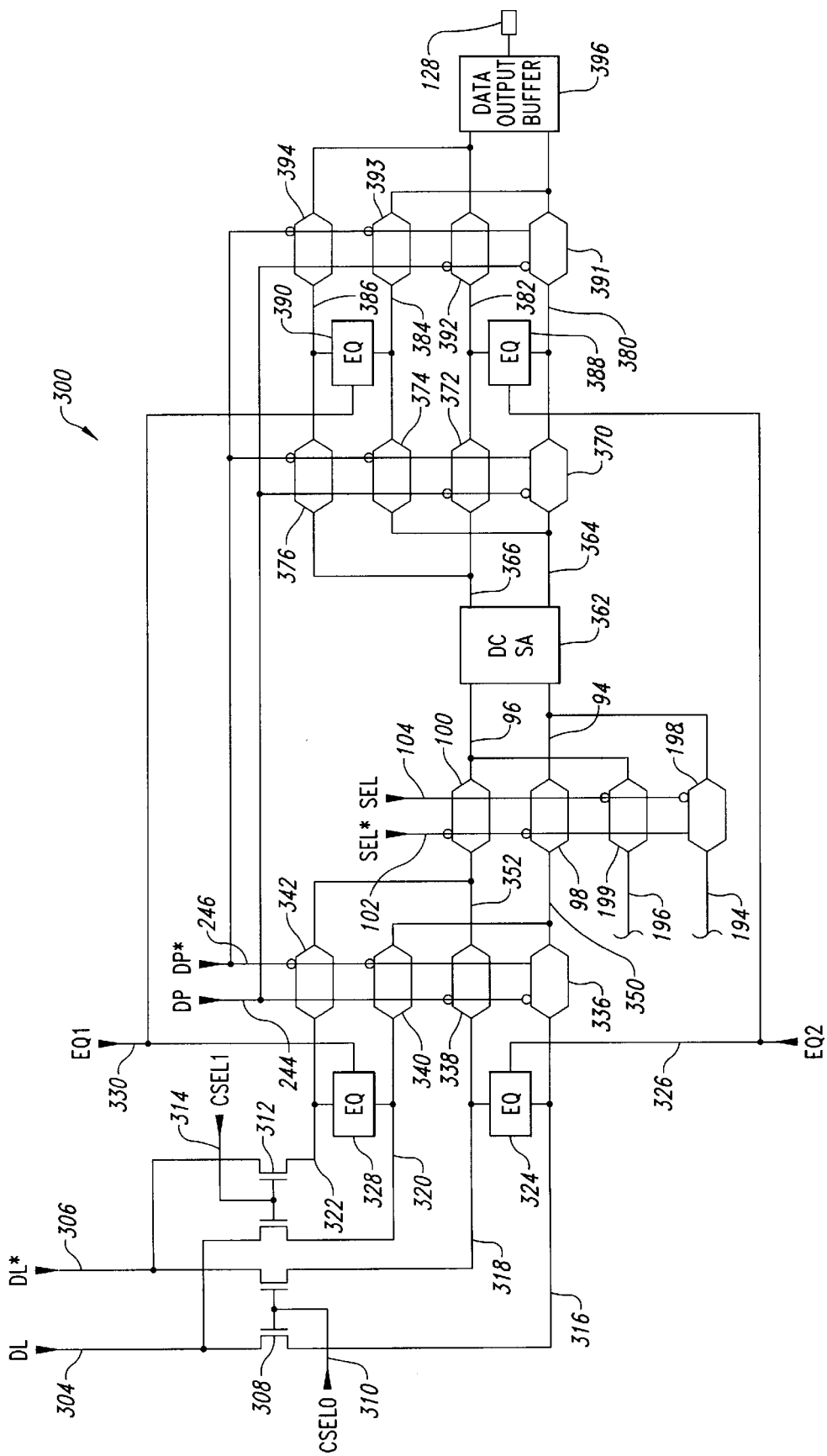
FIG. 5 is a block diagram of a hidden read data path according to another embodiment of the present invention.

Although any delay from equilibrating the I/O lines is masked by using a data path having two pairs of I/O lines, this advantage may be lost if there is also delay caused by the equilibration time for the data read lines 264, 266. Illustrated in FIG. 5 is an alternative embodiment of a hidden data path 300 that overcomes the aforementioned problem by including a second pair of complementary data read lines 384, 386 in addition to a second pair of I/O lines 320, 322. Two pairs of data read lines 380, 382 and 384, 386 are coupled in parallel to the DC sense amplifier 262 and a data output buffer 396. The advantage of the hidden data path 300 shown in FIG. 5 is that having a second pair of data read lines allows amplified differential signals to be immediately transferred from the DC sense amplifier 362 to the data output buffer 396.

In operation, a differential data signal on the digit lines 304, 306 is coupled to the DC sense amplifier 362 on the I/O lines 316, 318 or 320, 322, as described above with respect to the hidden data path 200 shown in FIG. 3. Both pairs of data read lines 380, 382 and 384, 386 of the hidden data path 300 are initially equilibrated to a reference voltage level prior to the DC sense amplifier 362 generating an amplified differential data signal. Only one pair of data read lines 380, 382 or 384, 386 will be enabled at a given time so the other pair may be equilibrated in anticipation of the next data transfer between the DC sense amplifier 362 and the output circuit 396. For example, when differential data is ready to be transmitted from the digit lines 304, 306 to the data output circuit 396, the CSEL0 signal goes high connecting I/O lines 316, 318 to the digit lines 304, 306, and the DP signal simultaneously goes low enabling the pass gates 336, 338, 370, 372, 391, 392. The EQ1 signal consequently goes high and activates equilibration circuits 328, 390, to equilibrate the uncoupled data path, that is, the I/O lines 320, 322 and the data read lines 384, 386. The differential data is transmitted from the digit lines 304, 306 to the DC sense amplifier 362 on the I/O lines 316, 318. The differential data is amplified by the DC sense amplifier 362 and transmitted to the data output circuit 396 on the data read lines 380, 382.

If a new differential data signal from memory array 20 is to be coupled immediately, the CSEL1 and DP signals will go high, coupling the I/O lines 320, 322 to the digit lines 304, 306, and coupling the data read lines 384, 386 to the DC sense amplifier 362 and the data output circuit 396. Simultaneously, the I/O lines 316, 318 and the data read lines 380, 382 will be uncoupled and equilibrated by the equilibration circuits 324, 388 in preparation for any subsequent differential data signals. The I/O lines and data read lines will continue to be alternatively coupled and equilibrated as long as data is being read from the memory cell array 20.

Figure 6:
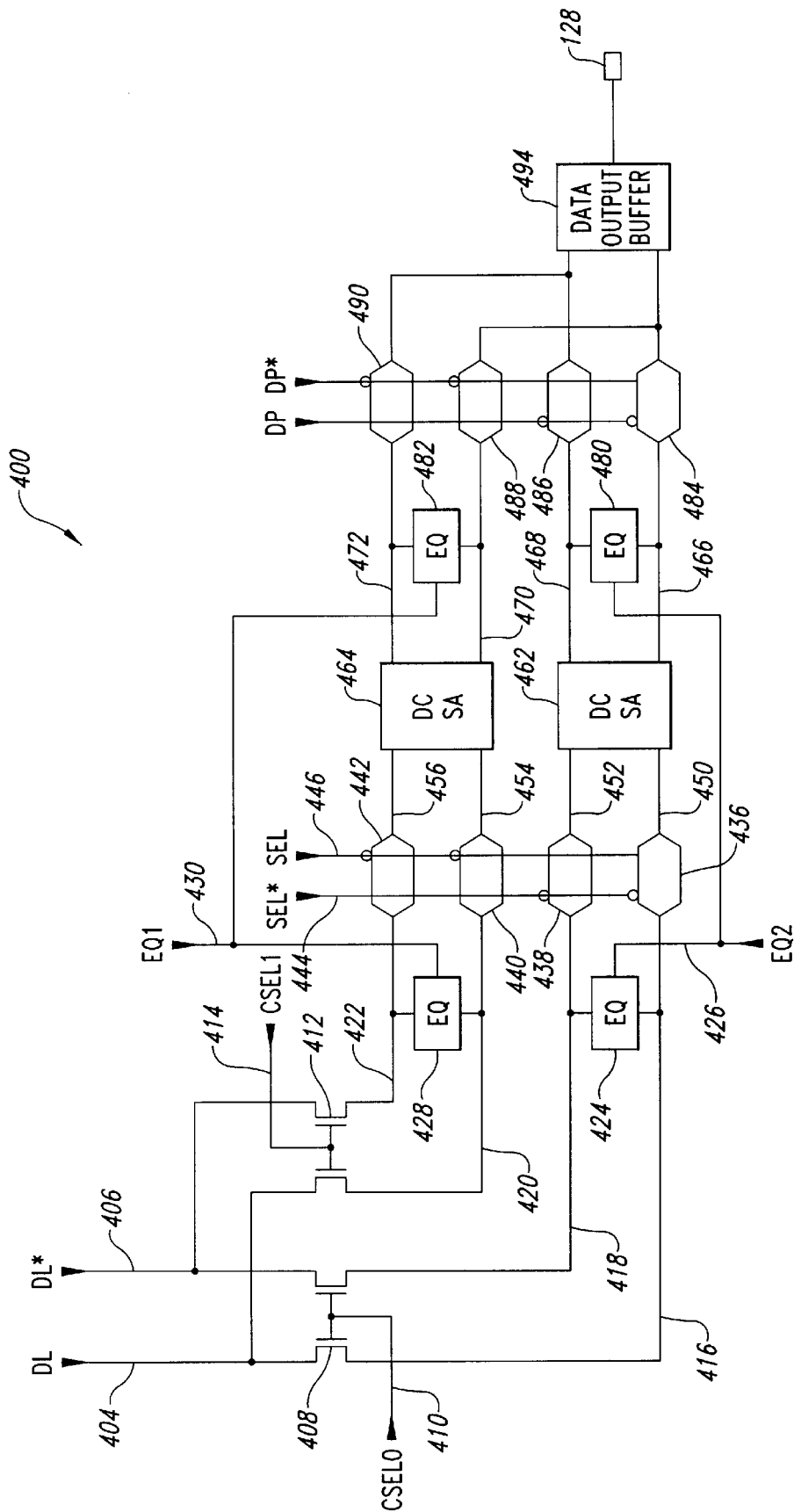
FIG. 6 is a block diagram of a of a hidden read data path according to another embodiment of the present invention.

Another embodiment of a hidden data path 400 is shown in FIG. 6. It consists of two pairs of I/O lines 416, 418, 420, 422, data lines 450, 452, 454, 456, data read lines 466, 468, 470, 472, and two separate DC sense amplifiers 462, 464, coupled in parallel between the digit lines 404, 406 and the data output circuit 494. Although the separate DC sense amplifier 464 is included in the hidden data path 400, the complexity of the data path 400 is reduced by eliminating the pass gates 336, 338, 340, 342 and 370, 372, 374, 376 from the circuit. Operation of the hidden data path 400 is similar to the data paths 200 and 300 shown in FIGS. 3 and 5, respectively. One pair of I/O lines, data lines, data read lines, and DC sense amplifier is coupled to transmit the differential data from the selected digit lines 404, 406 while the other is isolated and equilibrated in preparation for coupling a subsequent differential data signal. The CSEL0, CSEL1 signals are coordinated with the DP, DP* signals so the column switch 408 is enabled at the same time as the pass gates 484, 486, and column switch 412 is enabled at the same time as pass gates 488, 490. The EQ1 and EQ2 signals are also coordinated with the DP, DP* signals, as discussed above, so the appropriate equilibration circuits are activated for the uncoupled I/O lines, data lines, data read lines, and DC sense amplifier. Note that FIG. 6 does not show the additional pass gates necessary to share the DC sense amplifiers 462, 464 with other data lines (previously shown in FIGS. 3 and 5 as the nodes 194, 196 and the pass gates 198, 199). Omission of these elements from FIG. 6 was for the purpose of simplifying the figure shown and not meant to imply that the DC sense amplifiers 462, 464 cannot be shared with other data lines.

Although the embodiments of the present invention have been described as being used in a read data path, a hidden data path can just as easily and effectively be used to mask the equilibration time of a write data path. As previously described, portions of the read and write data paths are specific to a read or write operation, but do share the need to be equilibrated prior to receiving a differential data signal. Clearly then, having two pairs of data write lines connected in parallel between the input buffer and the write driver circuit, each having an equilibration circuit, can be used to mask delays caused by the equilibration time of the data write lines. As one ordinarily skilled any art will appreciate, pass gates should be connected to the data write lines in a manner similar to that shown in FIG. 5 for the two pairs of data read lines.

Similarly, the data paths described so far have included two pairs of complementary pairs of I/O lines and data read lines or data write lines. However, a second pair of data lines could also be used to mask the equilibration time of the data lines. Pass gates would be arranged to selectively couple one pair of data read lines while uncoupling the other pair to be equilibrated.

Figure 7:
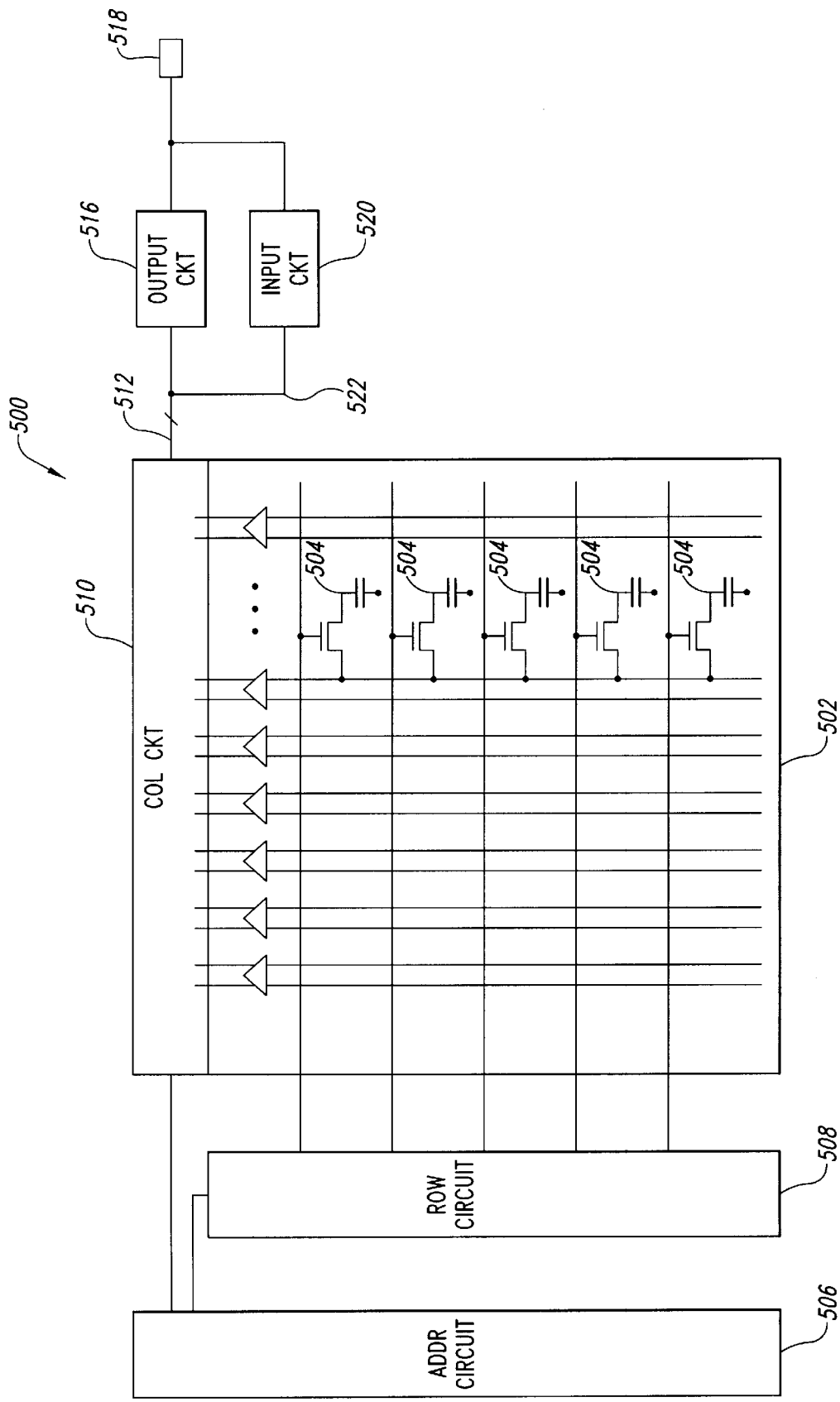
FIG. 7 is a block diagram of a memory device including an embodiment of the hidden read data path of FIGS. 3, 5, or 6.

FIG. 7 is a block diagram of several elements of a memory device 500 including a hidden data path similar to the one shown in FIGS. 3, 5, or 6. All or some of the principles explained above may be applicable to a variety of memory devices including, but not limited to, asynchronous and synchronous DRAM, packetized memory devices (e.g., SLDRAM memory devices), and SRAM devices.

The memory device also includes at least one memory cell array 502 comprised of memory cells 504 arranged in rows and columns. The memory cell array 502 includes a respective pair of digit lines for each column, a sense amplifier coupled to each pair of digit lines, and a set of multiplexers. The address circuitry 506 decodes an address of a selected memory cell to be read. When a row of memory cells from the array 502 is selected by the row circuitry 508, the data from each of the memory cells along the selected row is amplified by its respective sense amplifier and a differential data signal is generated on each pair of digit lines. A pair of digit lines from the memory cell array 502 is selected by the column circuitry 510 to be coupled to a respective hidden data path circuit 512. The hidden data path 512 contains elements as previously described in the various the embodiments of the present invention. The differential signal is amplified and transmitted by the hidden data path 512 circuit to an output circuit 516. The output circuit 516 includes a plurality of data output buffers and data bus terminals (not shown), which are structured to be selectively coupled to a data bus 518. Other logic circuitry in the memory device 500, but not shown in FIG. 7, are read/write control circuitry and associated multiplexers. The additional logic circuitry is necessary for other memory device operations, but is not shown in FIG. 6 in the interests of brevity.

Figure 8:
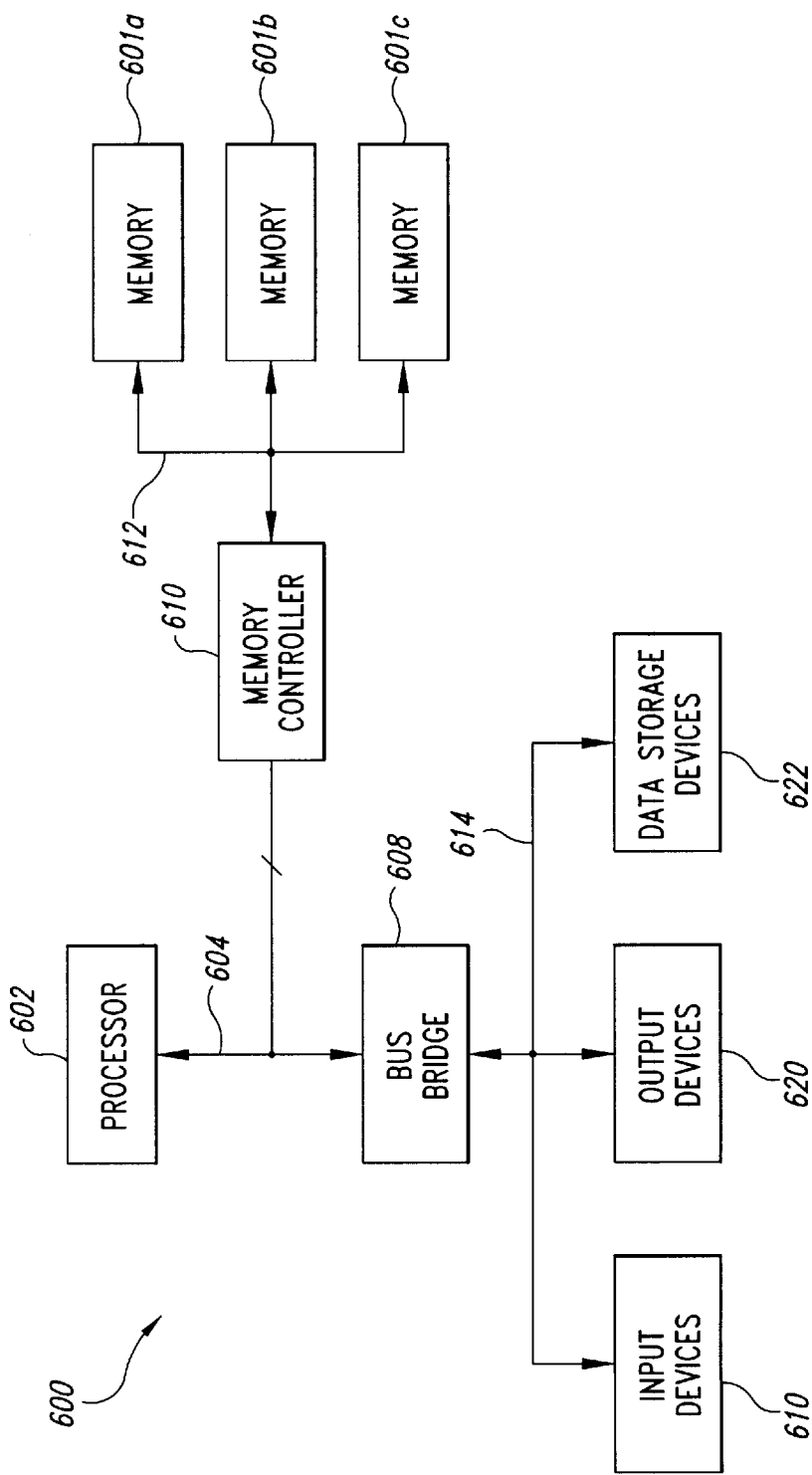
FIG. 8 is a block diagram of a computer system using a plurality of memory devices, each of which includes an embodiment of the hidden read data path of FIGS. 3, 5, or 6.

FIG. 8 is a block diagram of a computer system 600, which includes memory devices 601 having a hidden data path similar to those shown in FIGS. 3, 5, or 6. The computer system 600 includes a processor 602 for performing various computing functions, such as executing specific software to perform specific calculations or tasks. The processor 602 includes a processor bus 604 that includes an address bus, a control bus, and a data bus. In addition, the computer system 600 includes one or more input devices 610, such as a keyboard or a mouse, coupled to the processor 602 through a bus bridge 608 and expansion bus 614, such as an industry standard architecture ("ISA") bus or a peripheral component interconnect ("PCI") bus. The input device 610 allows an operator to interface with the computer system 600. The computer system 600 also includes one or more output devices 620 coupled to the processor 602, such as a printer or a video terminal, through the expansion bus 614, bus bridge 608, and processor bus 604. One or more data storage devices 622 may also be coupled to the processor 602 through the expansion bus 614, bus bridge 608, and processor bus 604 to allow the processor 602 to store data or retrieve data from internal or external storage media (not shown). Examples of typical storage devices 622 include hard and floppy disks, tape cassettes, and compact disk read-only memories (CD-ROMs). The processor 602 is also coupled to memory devices 601 through the processor bus 604. A memory controller 610 may be connected between the processor 602 and the memory devices 601 to facilitate memory access. The memory controller 610 includes a control bus and an address bus 612 which are coupled to the memory devices 601.

From the foregoing it will be appreciated that, although specific embodiment of the invention have been described herein for purposes of illustration, various modifications may be made without deviated from the spirit and scope of the invention. For example, as shown in FIG. 5, the I/O lines 316, 318 and the data lines 328, 330 are enabled at the same time as the data read lines 380, 384. However, a person ordinarily skilled in the art could appreciate that the data path shown in FIG. 5 would also operate if the signal lines 244, 246 were connected to the control terminals of the pass gates so the I/O lines 316, 318 and the data lines 328, 330 were enabled at the same time as the data read lines 384, 386. Also, the hidden data read path has been shown being used in conjunction with a hidden I/O and data line. However, a data path having only the two pairs of data read lines, but without two pairs of I/O and data lines, could be used without departing from the scope of the invention. Furthermore, although embodiments of the present invention have been illustrated as having a separate equilibration circuit for each data path, one ordinarily skilled in the art would appreciate that a single equilibration circuit maybe shared between two or more data paths if the equilibration circuit is coupled to the two data paths through a multiplexer or other suitable circuit. The multiplexer can be coupled to receive the existing data path select signals DP, DP* to select which data path the single equilibration circuit is to equilibrate. Accordingly, the invention is not limited except as by the appended claims.

We claim:

1. A data path for use in a memory device to couple a differential data signal from a first pair of complementary data nodes to a second pair of complementary data nodes, the data path comprising:

a first coupling device having a complementary pair of input terminals coupled to the first pair of complementary data nodes, the first coupling device having first and second complementary pairs of output terminals;

a second coupling device having first and second complementary pairs of input terminals and a complementary pair of output terminals coupled to the second pair of complementary data nodes;

a first complementary data path electrically coupled between the first output terminals of the first coupling device and the first input terminal of the second coupling device;

a second complementary data path electrically coupled between the second output terminals of the first coupling device and the second input terminal of the second coupling device; and at least one equilibration circuit selectively coupled to the first and second data paths.

2. The data path of claim 1 wherein the first and second complementary data paths comprise complementary I/O lines electrically coupled between a plurality of digit lines and a complementary pair of data lines.

3. The data path of claim 1 wherein the first and second complementary data paths comprise complementary data lines electrically coupled between a complementary pair of I/O lines and a DC sense amplifier.

4. The data path of claim 1 wherein the first and second complementary data paths comprise complementary I/O lines and data lines electrically coupled in series between a plurality of digit lines and a DC sense amplifier.

5. The data path of claim 1 wherein the first and second complementary data paths comprise complementary I/O lines, data lines, a DC sense amplifier, and complementary read data lines electrically coupled in series between a plurality of digit lines and a data output buffer.

6. The data path of claim 1 wherein the first and second complementary data paths comprise a DC sense amplifier, and complementary read data lines electrically coupled in series between a complementary pair of data lines and a data output buffer.

7. The data path of claim 1 wherein the first and second complementary data paths comprise a write driver circuit and a complementary pair of data write lines electrically coupled in series between an input buffer and complementary pair of data lines.

8. The data path of claim 1 wherein each of the first and second complementary data paths is coupled to at least one equilibration circuit to alternatively equilibrate the respective data paths.

9. A data path adapted for use in a memory device having a memory cell array, a pair of digit lines providing memory cell data from the memory cell array, and a sense amplifier producing a differential signal based on the memory cell data, the data path comprising:

an I/O line select circuit having a complementary pair of input terminals coupled to receive the differential signal from the sense amplifier and first and second complementary pairs of output terminals coupled to provide the differential signal, the I/O line select circuit alternatively selecting from the first and second pairs of output terminals to provide the differential signal;

first and second complementary pairs of I/O lines coupled to the first and second pairs of output terminals of the I/O select circuit, respectively, to transmit the differential signal;

a data line pass gate circuit having first and second complementary pairs of input terminals coupled to the first and second pair of I/O lines, respectively, and a complementary pair of output terminals, the pass gate circuit alternatively selecting from the first and second pairs of I/O lines to provide the differential signal to the complementary pair of output terminals; and first and second equilibration circuits electrically coupled to the first and second complementary pair of I/O lines, respectively, between the I/O line select circuit and the pass gate circuit, the equilibration circuits establishing a common and predetermined voltage on the respective complementary pair of I/O lines when the respective I/O lines is not selected by the data line pass gate circuit.

10. The data path of claim 9, further comprising:

a DC sense amplifier having a complementary pair of input terminals coupled to the complementary pair of output terminals of the data line pass gate and a complementary pair of output terminals, the DC sense amplifier being structured to generate an amplified differential signal at the pair of output terminals based on the differential signal received from the pass gate circuit;

a first data read line pass gate circuit having a complementary pair of input terminals coupled to the complementary pair of output terminals of the DC sense amplifier to receive the amplified signal and first and second complementary pairs of output terminals, the first data read line pass gate circuit alternatively selecting between the first and second pair of output terminals to be coupled to the input terminals and provide the amplified differential signal;

a first and second complementary pair of data read lines coupled to the first and second pairs of output terminals of the first data read line pass gate, respectively, to transmit the amplified differential signal;

a second data read line pass gate having first and second complementary pairs of input terminals coupled to the first and second pair of data read lines, respectively, and a complementary pair of output terminals, the second data read line pass gate circuit coupling the data read line selected by the first data read line pass gate circuit to the complementary pair of output terminals to provide the amplified differential signal; and third and fourth equilibration circuits coupled to the first and second complementary pair of data read lines, respectively, between the first and second data read line pass gate circuits, the equilibration circuits establishing a common and predetermined voltage on the respective complementary pair of data read lines when the respective data read line is not selected by the first and second data read line pass gate circuits.

11. The data path as in claim 10, further comprising a data output circuit having a complementary pair of input terminals coupled to the pair of output terminals of the second data read line pass gate circuit to receive the amplified differential signal, the data output circuit being structured to generate a data signal at a data output terminal based on the amplified signal.

12. The data path of claim 10 wherein the third and fourth equilibration circuits comprise:

a first switch having signal terminals coupled between the complementary pair of data read lines, and a control terminal, the first switch electrically coupling the pair of data read lines when the first switch is turned on; and a pair of switches series connected and coupled between the complementary pair of data read lines, and having an intermediate node between the switches coupled to a predetermined reference voltage and a pair of control terminals coupled together and to the control terminal of the first switch, the pair of switches providing the predetermined reference voltage to the pair of data read lines when the pair of switches is turned on.

13. The data path of claim 9 wherein the first and second equilibration circuits comprise:

a first switch having signal terminals coupled between the complementary pair of I/O lines, and a control terminal, the first switch electrically coupling the pair of I/O lines when the first switch is turned on; and a pair of switches series connected and coupled between the complementary pair of I/O lines, and having an intermediate node between the switches coupled to a predetermined reference voltage and a pair of control terminals coupled together and to the control terminal of the first switch, the pair of switches providing the predetermined reference voltage to the pair of I/O lines when the pair of switches is turned on.

14. A data path adapted for use in a memory device having a memory cell array, a pair of digit lines providing memory cell data from the memory cell array, and a sense amplifier producing a differential signal based on the memory cell data, the data path comprising:

an I/O line select circuit having a complementary pair of input terminals coupled to the sense amplifier and first and second complementary pairs of output terminals coupled to provide the differential signal, the I/O line select circuit alternatively selecting from the first and second pairs of output terminals to provide the differential signal;

first and second complementary pairs of I/O lines coupled to the first and second pairs of output terminals of the I/O select circuit, respectively, to transmit the differential signal;

a data line pass gate circuit having first and second complementary pairs of input terminals coupled to the first and second pair of I/O lines, respectively, and a complementary pair of output terminals, the pass gate circuit alternatively selecting between the first and second pairs of I/O lines to couple to the complementary pair of output terminals to transmit the differential signal;

a first equilibration circuit electrically coupled to the first complementary pair of I/O lines between the I/O line select circuit and the pass gate circuit, the first equilibration circuit establishing a predetermined voltage on the first complementary pair of I/O lines when not selected by the pass gate circuit;

a second equilibration circuit electrically coupled to the second complementary pair of I/O lines between the I/O line select circuit and the pass gate circuit, the second equilibration circuit establishing a predetermined voltage on the second complementary pair of I/O lines when not selected by the pass gate circuit; and a DC sense amplifier having a complementary pair of input terminals coupled to the complementary pair of output terminals of the pass gate and a complementary pair of output terminals, the DC sense amplifier being structured to generate an amplified signal at the complementary pair of output terminals based on the differential signal received from the pass gate circuit.

15. A data path as in claim 14, further comprising:
a first data read line pass gate circuit having a complementary pair of input terminals coupled to the complementary pair of output terminals of the DC sense amplifier to receive the amplified signal and first and second complementary pairs of output terminals, the first data read line pass gate circuit alternatively selecting from the first and second pair of output terminals to be coupled to the input terminals and provide the amplified signal;
a first and second complementary pair of data read lines coupled to the first and second pairs of output terminals of the first day to read line past gate, respectively;
a second data read line pass gate having first and second complementary pairs of input terminals coupled to the first and second pair of data read lines, respectively, and a complementary pair of output terminals, the second data read line pass gate circuit coupling the data read line selected by the first data read line to the complementary pair of output terminals to provide the amplified signal;
a third equilibration circuit electrically coupled to the first complementary pair of data read lines between the first and second data read line pass gate circuits, the third equilibration circuit establishing a predetermined voltage on the first complementary pair of data read lines when not coupled by the first and second data read line pass gate circuits;
a fourth equilibration circuit electrically coupled to the second complementary pair of data read lines between the first and second data read line pass gate circuits, the fourth equilibration circuit establishing a predetermined voltage on the second complementary pair of data read lines when not coupled by the first and second data read line pass gate circuits; and
a data output circuit having a complementary pair of input terminals coupled to the pair of output terminals of the second data read line pass gate circuit to receive the amplified signal, the data output circuit being structured to generate a data signal at a data output terminal based on the amplified signal.

16. A memory device comprising:
at least one array of memory cells arranged in rows and columns, each of the rows having a row line and each of the columns having a complementary pair of digit lines;
a sense amplifier for each column, each sense amplifier having a pair of terminals coupled respectively to the digit lines of a respective one of the columns, the sense amplifier being structured to amplify a differential data signal on the digit lines;
a data path for coupling the differential data signal from a first pair of complementary data nodes to a second pair of complementary data nodes, the data path comprising:
a first multiplexer having a complementary pair of input terminals coupled to the first pair of complementary data nodes, the first multiplexer having first and second complementary pairs of output terminals;
a second multiplexer having first and second complementary pairs of input terminals and a complementary pair of output terminals coupled to the second pair of complementary data nodes;
a first complementary data path coupled between the first output terminals of the first multiplexer and the first input terminal of the second multiplexer;
a second complementary data path coupled between the second output terminals of the first multiplexer and the second input terminal of the second multiplexer;
at least one equilibration circuit capable of coupling to the first and second data paths;
a DC sense amplifier having a complementary pair of inputs coupled to the data path to receive the differential data signal and a complementary pair of output terminals, the DC sense amplifier being structured to generate an amplified differential signal at the pair of output terminals based on the differential data signal received from the data path; and
a data output circuit having a complementary pair of input terminals coupled to the pair of output terminals of the DC sense amplifier to receive the amplified differential signal, the data output circuit being structured to provide a data signal to the data output terminal based on the amplified differential signal.

17. The memory device of claim 16 wherein the first and second complementary data paths comprise I/O lines electrically coupled between a plurality of digit lines and a complementary pair of data lines.

18. The memory device of claim 16 wherein the first and second complementary data paths comprise data lines electrically coupled between a complementary pair of I/O lines and a DC sense amplifier.

19. The memory device of claim 16 wherein the first and second complementary data paths comprise I/O lines and data lines electrically coupled in series between a plurality of digit lines and a DC sense amplifier.

20. The data path of claim 16 wherein the first and second complementary data paths comprise I/O lines, data lines, a DC sense amplifier, and read data lines electrically coupled in series between a plurality of digit lines and a data output buffer.

21. The memory device of claim 16 wherein the first and second complementary data paths comprise a DC sense amplifier, and read data lines electrically coupled in series between a complementary pair of data lines and a data output buffer.

22. The memory device of claim 16 wherein the first and second complementary data paths comprise a write driver circuit and a complementary pair of data write lines electrically coupled in series between an input buffer and complementary pair of data lines.

23. The memory device of claim 16 wherein the first and second complementary data paths have at least one equilibration circuit to alternatively equilibrate the respective data paths.

24. A memory device comprising:
at least one array of memory cells arranged in rows and columns, each of the rows having a row line and each of the columns having a complementary pair of digit lines;
a sense amplifier for each column, each sense amplifier having a pair of terminals coupled respectively to the digit lines of a respective one of the columns, the sense amplifier being structured to amplify a differential data signal on the digit lines;
a data path being coupled to a selected one of the pairs of digit lines to receive the differential data signal from the selected digit lines, the data path comprising:

an I/O line select circuit having a complementary pair of input terminals receiving the differential signal, and first and second complementary output terminals, the I/O line select circuit alternatively selecting from the first and second pairs of output terminals to provide the differential signal;

first and second complementary pairs of I/O lines coupled to the first and second pairs of output terminals of the I/O select circuit, respectively, to transmit the differential signal;

a data line pass gate circuit having first and second complementary pairs of input terminals coupled to the first and second pair of I/O lines, respectively, and a complementary pair of output terminals, the pass gate circuit alternatively selecting from the first and second pairs of I/O lines to provide the differential signal to the complementary pair of output terminals; and first and second equilibration circuits electrically coupled to the first and second complementary pair of I/O lines, respectively, between the I/O line select circuit and the data line pass gate circuit, the equilibration circuits establishing a common and predetermined voltage on the respective complementary pair of I/O lines when the respective I/O lines is not selected by the data line pass gate circuit;

a DC sense amplifier having a complementary pair of inputs coupled to the data path to receive the differential data signal and a complementary pair of output terminals, the DC sense amplifier being structured to generate an amplified differential signal at the pair of output terminals based on the differential data signal received from the data path; and a data output circuit having a complementary pair of input terminals coupled to the pair of output terminals of the DC sense amplifier to receive the amplified differential signal, the data output circuit being structured to provide a data signal to the data output terminal based on the amplified differential signal.

25. The memory device of claim 24, further comprising:

a first data read line pass gate circuit having a complementary pair of input terminals coupled to the complementary pair of output terminals of the DC sense amplifier to receive the amplified signal and first and second complementary pairs of output terminals, the first data read line pass gate circuit alternatively selecting from the first and second pair of output terminals to be coupled to the input terminals and provide the amplified signal;

a first and second complementary pair of data read lines coupled to the first and second pairs of output terminals of the first data read line pass gate, respectively;

a second data read line pass gate having first and second complementary pairs of input terminals coupled to the first and second pair of data read lines, respectively, and a complementary pair of output terminals coupled to the data output circuit, the second data read line pass gate circuit coupling the data read line selected by the first data read line pass gate circuit to the complementary pair of output terminals to provide the amplified signal; and third and fourth equilibration circuits electrically coupled to the first and second complementary pair of data read lines, respectively, between the first and second data read line pass gate circuits, the equilibration circuits establishing a predetermined voltage on the respective complementary pair of data read lines when the respective data read line is not selected by the first and second data read line pass gate circuits.

26. A computer system comprising:

a processor having a processor bus;

an input device coupled to the processor through the processor bus and adapted to allow data to be entered into the computer system;

an output device coupled to the processor through the processor bus and adapted to allow data to be output from the computer system; and a memory device coupled to the processor through the processor bus, the memory device comprising:

at least one array of memory cells arranged in rows and columns, each of the rows having a row line and each of the columns having a complementary pair of digit lines;

a sense amplifier for each column, each sense amplifier having a pair of terminals coupled respectively to the digit lines of a respective one of the columns, the sense amplifier being structured to amplify a differential data signal on the digit lines;

a data path for coupling the differential data signal from a first pair of complementary data nodes to a second pair of complementary data nodes, the data path comprising:

a first multiplexer having a complementary pair of input terminals coupled to the first pair of complementary data nodes, the first multiplexer having first and second complementary pairs of output terminals;

a second multiplexer having first and second complementary pairs of input terminals and a complementary pair of output terminals coupled to the second pair of complementary data nodes;

a first complementary data path electrically coupled between the first output terminals of the first multiplexer and the first input terminal of the second multiplexer;

a second complementary data path electrically coupled between the second output terminals of the first multiplexer and the second input terminal of the second multiplexer;

at least one equilibration circuit capable of coupling to the first and second data paths;

a DC sense amplifier having a complementary pair of inputs coupled to the data path to receive the differential data signal and a complementary pair of output terminals, the DC sense amplifier being structured to generate an amplified differential signal at the pair of output terminals based on the differential data signal received from the data path; and a data output circuit having a complementary pair of input terminals coupled to the pair of output terminals of the DC sense amplifier to receive the amplified differential signal, the data output circuit being structured to provide a data signal to the data output terminal based on the amplified differential signal.

27. The computer system of claim 26 wherein the first and second complementary data paths comprise I/O lines electrically coupled between a plurality of digit lines and a complementary pair of data lines.

28. The computer system of claim 26 wherein the first and second complementary data paths comprise data lines electrically coupled between a complementary pair of I/O lines and a DC sense amplifier.

29. The computer system of claim 26 wherein the first and second complementary data paths comprise I/O lines and data lines electrically coupled in series between a plurality of digit lines and a DC sense amplifier.

30. The computer system of claim 26 wherein the first and second complementary data paths comprise I/O lines, data lines, a DC sense amplifier, and read data lines electrically coupled in series between a plurality of digit lines and a data output buffer.

31. The computer system of claim 26 wherein the first and second complementary data paths comprise a DC sense amplifier, and read data lines electrically coupled in series between a complementary pair of data lines and a data output buffer.

32. The computer system of claim 26 wherein the first and second complementary data paths comprise a write driver circuit and a complementary pair of data write lines electrically coupled in series between an input buffer and complementary pair of data lines.

33. The computer system of claim 26 wherein the first and second complementary data paths have at least one equilibration circuit to alternatively equilibrate the respective data paths.

34. A computer system comprising:
a processor having a processor bus;
an input device coupled to the processor through the processor bus and adapted to allow data to be entered into the computer system;
an output device coupled to the processor through the processor bus and adapted to allow data to be output from the computer system; and
a memory device coupled to the processor through the processor bus, the memory device comprising:
at least one array of memory cells arranged in rows and columns, each of the rows having a row line and each of the columns having a complementary pair of digit lines;
a sense amplifier for each column, each sense amplifier having a pair of terminals coupled respectively to the digit lines of a respective one of the columns, the sense amplifier being structured to amplify a differential data signal on the digit lines;
a data path being coupled to a selected one of the pairs of digit lines to receive the differential data signal from the selected digit lines, the data path comprising:
an I/O line select circuit having a complementary pair of input terminals receiving the differential signal, and first and second complementary output terminals, the I/O line select circuit alternatively selecting from the first and second pairs of output terminals to provide the differential signal;
first and second complementary pairs of I/O lines coupled to the first and second pairs of output terminals of the I/O select circuit, respectively, to transmit the differential signal;
a data line pass gate circuit having first and second complementary pairs of input terminals coupled to the first and second pair of I/O lines, respectively, and a complementary pair of output terminals, the pass gate circuit alternatively selecting from the first and second pairs of I/O lines to couple to the complementary pair of output terminals to transmit the differential signal; and
first and second equilibration circuits electrically coupled to the first and second complementary pair of I/O lines, respectively, between the I/O line select circuit and the data line pass gate circuit, the equilibration circuits establishing a predetermined voltage on the respective complementary pair of I/O lines when the respective I/O lines is not selected by the data line pass gate circuit;
a DC sense amplifier having a complementary pair of inputs coupled to the data path to receive the differential data signal and a complementary pair of output terminals, the DC sense amplifier being structured to generate an amplified differential signal at the pair of output terminals based on the differential data signal received from the data path; and
a data output circuit having a complementary pair of input terminals coupled to the pair of output terminals of the DC sense amplifier to receive the amplified differential signal, the data output circuit being structured to provide a data signal to the data output terminal based on the amplified differential signal.

35. The computer system of claim 34 wherein the memory device further comprises:
a first data read line pass gate circuit having a complementary pair of input terminals coupled to the complementary pair of output terminals of the DC sense amplifier to receive the amplified signal and first and second complementary pairs of output terminals, the first data read line pass gate circuit alternatively selecting between the first and second pair of output terminals to be coupled to the input terminals and provide the amplified signal;
a first and second complementary pair of data read lines coupled to the first and second pairs of output terminals of the first data read line pass gate, respectively;
a second data read line pass gate having first and second complementary pairs of input terminals coupled to the first and second pair of data read lines, respectively, and a complementary pair of output terminals coupled to the data output circuit, the second data read line pass gate circuit coupling the data read line selected by the first data read line pass gate circuit to the complementary pair of output terminals to provide the amplified signal; and
third and fourth equilibration circuits coupled to the first and second complementary pair of data read lines, respectively, between the first and second data read line pass gate circuits, the equilibration circuits establishing a predetermined voltage on the respective complementary pair of data read lines when the respective data read line is not selected by the first and second data read line pass gate circuits.

36. A method of coupling differential data in a memory device from a first pair of complementary data nodes to a second pair of complementary data nodes, the method comprising:
selecting alternatively from first and second complementary data paths, each electrically coupled between the first and second pairs of complementary data nodes, a selected data path to couple the differential data from the first pair of complementary data nodes to the second pair of complementary data nodes and an unselected data path to be electrically isolated from the first and second complementary data nodes; and
equilibrating the unselected data path.

37. The method of claim 36 wherein selecting alternatively comprises selecting from first and second complementary I/O lines electrically coupled between a plurality of digit lines and a complementary pair of data lines.

38. The method of claim 36 wherein selecting alternatively comprises selecting from first and second complementary data lines electrically coupled between a complementary pair of I/O lines and a DC sense amplifier.

39. The method of claim 36 wherein selecting alternatively comprises selecting from first and second complementary I/O lines and data lines electrically coupled in series between a plurality of digit lines and a DC sense amplifier.

40. The method of claim 36 wherein selecting alternatively comprises selecting from first and second complementary I/O lines, data lines, a DC sense amplifier, and complementary read data lines electrically coupled in series between a plurality of digit lines and a data output buffer.

41. The method of claim 36 wherein selecting alternatively comprises selecting from first and second DC sense amplifiers, and complementary read data lines electrically coupled in series between a complementary pair of data lines and a data output buffer.

42. The method of claim 36 wherein selecting alternatively comprises selecting from first and second write driver circuits and complementary pair of data write lines electrically coupled in series between an input buffer and complementary pair of data lines.

43. A method of coupling differential data in a memory device from a first pair of complementary data nodes to a second pair of complementary data nodes, the method comprising:

selecting alternatively from first and second complementary data paths, each extending between the first and second pairs of complementary data nodes, a selected data path to couple the differential data from the first pair of complementary data nodes to the second pair of complementary data nodes and an unselected data path to be electrically isolated from the first and second complementary data nodes; and equilibrating the unselected data path by using at least one equilibration circuit to alternatively equilibrate the respective data paths.

44. A method of coupling a data signal to a data output circuit of a memory device having a memory cell array arranged in rows and columns, a pair of digit lines providing memory cell data from the memory cell array, and a sense amplifier producing a differential signal based on the memory cell data, the method comprising:

selecting alternatively between a first and second complementary pair of I/O lines to receive and transmit the differential signal;

equilibrating the complementary pair of I/O lines not selected;

coupling the selected complementary pair of I/O lines to a DC sense amplifier to produce at its output an amplified differential signal based on the differential signal; and coupling the output of the DC sense amp to the data output circuitry.

45. The method of claim 44 wherein coupling the output of the DC sense amp to the data output circuitry comprises:

selecting alternatively between a first and second complementary pair of data read lines to receive and transmit the data signal from the DC sense amplifier;

equilibrating the complementary pair of data read lines not selected; and coupling the selected complementary pair of data read lines to the data output circuitry.

46. A method of coupling a data signal to a data output circuit of a memory device having a memory cell array arranged in rows and columns, a pair of digit lines providing memory cell data from the memory cell array, and a sense amplifier producing a differential signal based on the memory cell data, the method comprising:

selecting alternatively between a first and second complementary pair of I/O lines to receive and transmit the differential signal;

equilibrating the complementary pair of I/O lines not selected, coupling the selected complementary pair of I/O lines to a DC sense amplifier to produce at its output an amplified differential signal based on the differential signal; and coupling the output of the DC sense amp to the data output circuitry, wherein the coupling comprises:

selecting alternatively between the first and second complementary pair of data read lines to receive and transmit the data signal from the DC sense amplifier by selecting the first pair of data read lines when the first complementary pair of I/O lines is selected, and selecting the second pair of data read lines when the second pair of I/O lines is selected;

equilibrating the complementary pair of data read lines not selected; and coupling the selected complementary pair of data read lines to the data output circuitry.

47. The method of claim 44 wherein equilibrating the complementary pair of I/O lines comprises:

coupling the complementary pair of I/O lines together to equalize an electrical potential on each I/O line; and coupling the complementary pair of I/O lines to a predetermined reference voltage to precondition the electrical potential on each I/O line.

48. A method of coupling a differential data signal from a data input circuit of the memory device having a memory cell array arranged in rows and columns, and a pair of digit lines providing the differential data signal to the memory cell array, the method comprising:

selecting alternatively between a first and second complementary pair of data write lines to couple to and transmit the differential data signal from the data input circuit to a write driver circuit;

equilibrating the complementary pair of data write lines not selected;

coupling the selected complementary pair of data write lines to the write driver circuit to write the differential data signal to the memory cell array; and coupling the output of the write driver circuit to the pair of digit lines to transmit the differential data signal to the memory cell array.

49. The method of claim 48 wherein coupling the output of the write driver circuit to the pair of digit lines comprises:

selecting alternatively between a first and second complementary pair of I/O lines to couple to and transmit the differential signal from the write driver circuit;

equilibrating the complementary pair of I/O lines not selected; and coupling the selected complementary pair of I/O lines to the write diver circuit and the pair of digit lines.

* * * * *